US011716073B2

(12) United States Patent
Hsu et al.

(10) Patent No.: US 11,716,073 B2
(45) Date of Patent: Aug. 1, 2023

(54) CHIP WITH PAD TRACKING

(71) Applicant: MEDIATEK INC., Hsinchu (TW)

(72) Inventors: Hsin-Cheng Hsu, Hsinchu (TW); Jui-Ming Chen, Hsinchu (TW); Federico Agustin Altolaguirre, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 17/580,952

(22) Filed: Jan. 21, 2022

(65) Prior Publication Data

US 2022/0329232 A1 Oct. 13, 2022

Related U.S. Application Data

(60) Provisional application No. 63/171,643, filed on Apr. 7, 2021.

(51) Int. Cl.
*H03K 3/012* (2006.01)
*H03K 5/02* (2006.01)

(52) U.S. Cl.
CPC ............... *H03K 3/012* (2013.01); *H03K 5/02* (2013.01)

(58) Field of Classification Search
CPC ........... H03K 3/012; H03K 19/018592; H03K 19/018521; H03K 19/00315
See application file for complete search history.

(56) References Cited

U.S. PATENT DOCUMENTS 6,323,664 B1 * 11/2001 Kim ....................... G11C 29/48 365/201
6,657,835 B2 12/2003 Ker et al.
8,179,160 B1 * 5/2012 Chauhan .......... H03K 3/356182 326/26
10,359,961 B2 7/2019 Ito et al.
(Continued)

FOREIGN PATENT DOCUMENTS

CN 106688039 B 3/2019
EP 3 451 537 A1 3/2019
(Continued)

OTHER PUBLICATIONS

Extended European Search Report dated Sep. 8, 2022, issued in application No. EP 22160628.8.
(Continued)

*Primary Examiner* — Sibin Chen
(74) *Attorney, Agent, or Firm* — McClure, Qualey & Rodack, LLP

(57) ABSTRACT

A chip with pad tracking having an input/output buffer (I/O buffer), a pad, and a bias circuit. The I/O buffer is powered by a first power and is coupled to the pad. The pad is coupled to the system power. The bias circuit generates a bias signal to be transferred to the I/O buffer to block a leakage path within the I/O buffer when the system power is on and the first power is off. The bias circuit is a voltage divider which generates a divided voltage as the bias signal. In an example, the bias circuit is powered by a second power that is independent from the first power and is not drawn from the pad. In another example, a power terminal of the bias circuit is coupled to an electrostatic discharging bus, and the pad is coupled to the electrostatic discharging bus through a diode.

12 Claims, 4 Drawing Sheets

(56) References Cited

U.S. PATENT DOCUMENTS

| | | | | |
|---|---|---|---|---|
| 11,509,305 | B2 | 11/2022 | Froidevaux et al. | |
| 2005/0078419 | A1* | 4/2005 | Stockinger | H01L 27/0292 361/56 |
| 2007/0170955 | A1 | 7/2007 | Narwal et al. | |
| 2010/0097117 | A1* | 4/2010 | Wang | H03K 19/0013 327/333 |
| 2019/0319613 | A1* | 10/2019 | Hsu | H03K 17/08104 |
| 2021/0279197 | A1* | 9/2021 | Hamlyn | H03K 19/00315 |

FOREIGN PATENT DOCUMENTS

| | | | |
|---|---|---|---|
| EP | 3 731 414 | A1 | 10/2020 |
| TW | 473979 | B | 1/2002 |

OTHER PUBLICATIONS

Chinese language office action dated Dec. 5, 2022, issued in application No. TW 111111223.

* cited by examiner

CHIP WITH PAD TRACKING

CROSS REFERENCE TO RELATED APPLICATIONS

This application claims the benefit of U.S. Provisional Application No. 63/171,643, filed Apr. 7, 2021 the entirety of which is incorporated by reference herein.

BACKGROUND OF THE INVENTION

Field of the Invention

The present invention relates to a chip with pad tracking.

Description of the Related Art

In some situations, a chip may not receive power even though the system power has been turned on. Current from the system power may be fed into the chip through the chip's pad. A pad-tracking design is required to block such a leakage path.

However, the power consumed by such a pad-tracking design may increase with the number of pads of the chip. How to suppress the power consumption of the pad-tracking design is an important issue in the field of chip design.

BRIEF SUMMARY OF THE INVENTION

A chip with pad tracking is shown.

A chip with pad tracking in accordance with an exemplary embodiment of the present invention has an input/output buffer (I/O buffer), a pad, and a bias circuit. The I/O buffer is powered by a first power and is coupled to the pad. The pad is coupled to the system power. The bias circuit generates a bias signal for the I/O buffer to block a leakage path within the I/O buffer when the system power is on and the first power is off. The bias circuit is a voltage divider which generates a divided voltage as the bias signal. In an exemplary embodiment, the bias circuit is powered by a second power that is independent from the first power and is not drawn from the pad. In exemplary embodiment, a power terminal of the bias circuit is coupled to an electrostatic discharging bus of the chip. The pad is coupled to the electrostatic discharging bus through a diode.

Because the bias circuit of the present invention is power by an additional power or an electrostatic discharging bus, the bias circuit is an external design not bounded with an I/O buffer. The present invention proposes an external bias circuit for pad tracking of a chip.

In an exemplary embodiment, the I/O buffer comprises a floating N-well pull-up string, and a pad-tracking circuit. According to the bias signal, the pad-tracking circuit couples the pad to a gate and a bulk of a leakage-blocking transistor of the floating N-well pull-up string. Accordingly, the leakage-blocking transistor is turned off, and the leakage path within the floating N-well pull-up string is broken.

In an exemplary embodiment, the pad-tracking circuit comprises a p-type transistor coupled between the gate of the leakage-blocking transistor and the pad. The gate of the p-type transistor is controlled by the bias signal. The p-type transistor is turned on when the bias signal is at a proper voltage level.

In an exemplary embodiment, the pad-tracking circuit comprises a p-type transistor coupled between the bulk of the leakage-blocking transistor and the pad. The gate of the p-type transistor is controlled by the bias signal. The p-type transistor is turned on when the bias signal is at a proper voltage level.

The external bias circuit can be shared by the I/O buffers of the different pads.

In another exemplary embodiment, a chip with pad tracking in accordance with an exemplary embodiment of the present invention has a plurality of pads, a plurality of I/O buffers, and a bias circuit shared by the different I/O buffers. Because only one bias circuit is required, power consumption is considerably reduced.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
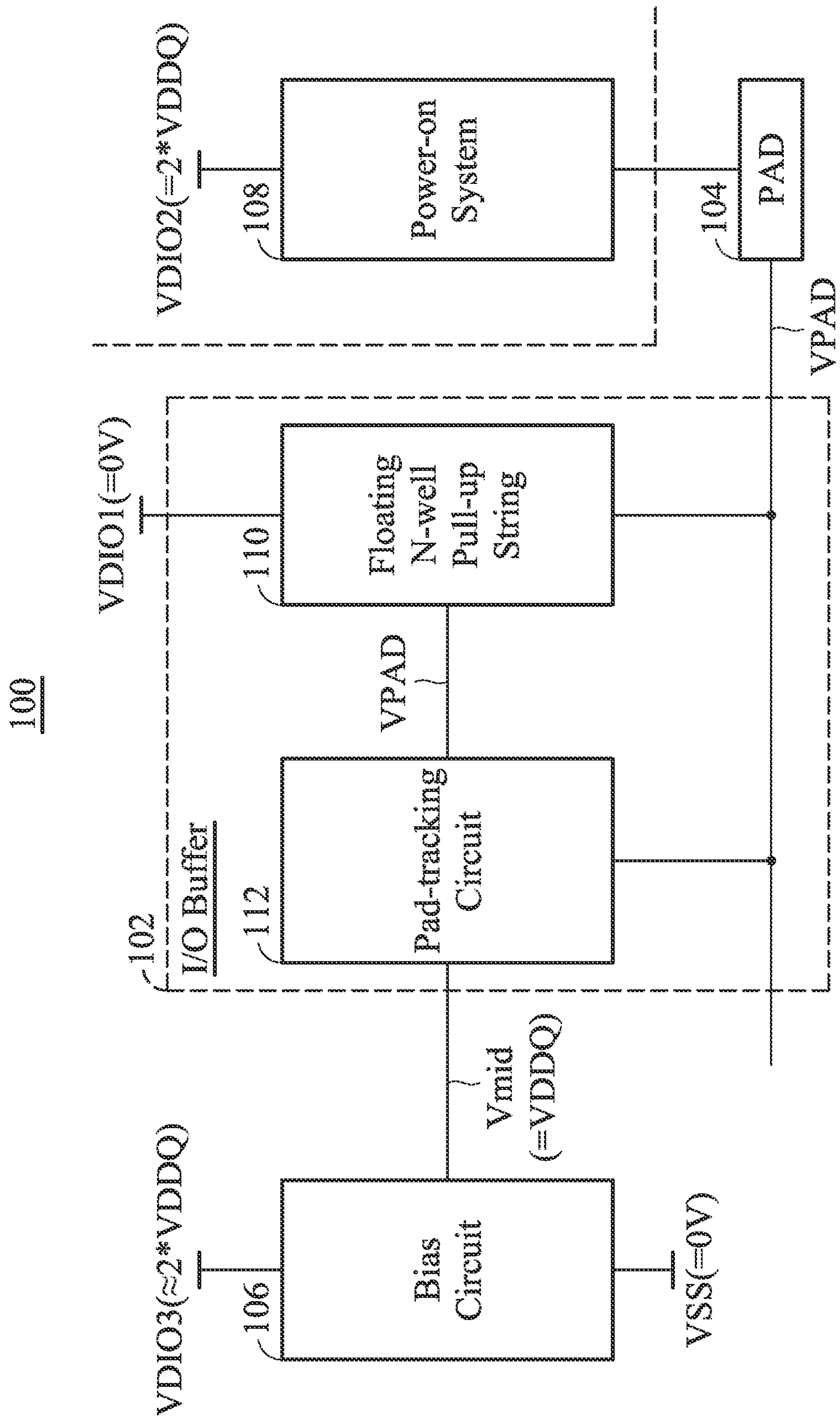
FIG. 1 illustrates a chip 100 with pad tracking in accordance with an exemplary embodiment of the present invention.

FIG. 1 illustrates a chip 100 with pad tracking in accordance with an exemplary embodiment of the present invention.

The chip 100 with pad tracking has an input/output buffer (I/O buffer) 102, a pad 104, and a bias circuit 106. The I/O buffer 102 powered by the chip's power VDIO1 is coupled to the pad 104, and the pad 104 is coupled to the system power VDIO2 (e.g., through a power-on system 108). In this case, the chip 100 is an overdriven device. The normal voltage level of the chip's power VDIO1 and the system power VDIO2 is 2*VDDQ. FIG. 1 shows a situation that the system power VDIO2 has been turned on (VDIO2 is 2*VDDQ) but the chip's power VDIO1 has not been turned on yet (VDIO1 is 0 volts).

In FIG. 1, only the pull-up path of the I/O buffer 102 is shown. The pull-down path of the I/O buffer 102 is not shown in FIG. 1 for simplicity. The I/O buffer 102 includes a floating N-well pull-up string 110, and a pad-tracking circuit 112. The pad-tracking circuit 112 is biased by a bias signal Vmid generated by the bias circuit 106. According to the bias signal Vmid, the pad-tracking circuit 112 couples the pad 104 to the floating N-well pull-up string 110. As shown, the pad level VPAD is coupled to the floating N-well pull-up string 110 through the pad-tracking circuit 112 when the bias voltage Vmid is at the proper voltage level. Referring to the power situation shown in FIG. 1 wherein the system power VDIO2 is on (=2*VDDQ) and the chip's power VDIO1 is off (=0 volts), a leakage path within the I/O buffer 102 from the pad 104 (with VPAD at 2*VDDQ) to the 0V VDIO1 is broken due to the pad level VPAD (=2*VDDQ) supplied to the floating N-well pull-up string 110 (e.g., coupled to the gate of one transistor of the floating N-well pull-up string 110). The unnecessary current consumption is prevented.

The bias circuit 106 is powered by another power VDIO3. In the power situation shown in FIG. 1 wherein the system power VDIO2 is on (=2*VDDQ) and the chip's power VDIO1 is off (=0 volts), the power VDIO3 is on (≈2*VDDQ). Note that the power VDIO3 is not directly drawn from the pad voltage VPAD. In an exemplary embodiment, VDIO3 is an additional power that is independent from the chip's power VDIO1 and is not drawn from the pad VPAD. In another exemplary embodiment, VDIO3 is provided by an electrostatic discharging bus (EBUS) of the chip 100. The pad 104 is coupled to the electrostatic discharging bus (EBUS) through a diode. When the system power VDIO2 is turned on (=2*VDDQ), the bias circuit 106 is powered by the electrostatic discharging bus (EBUS) that is at a voltage level near 2*VDDQ. The bias circuit 106 is a voltage divider which generates a divided voltage as the bias signal Vmid. For example, the bias voltage Vmid may be VDDQ, which is a proper voltage level to bias the pad tracking circuit 112.

Figure 2:
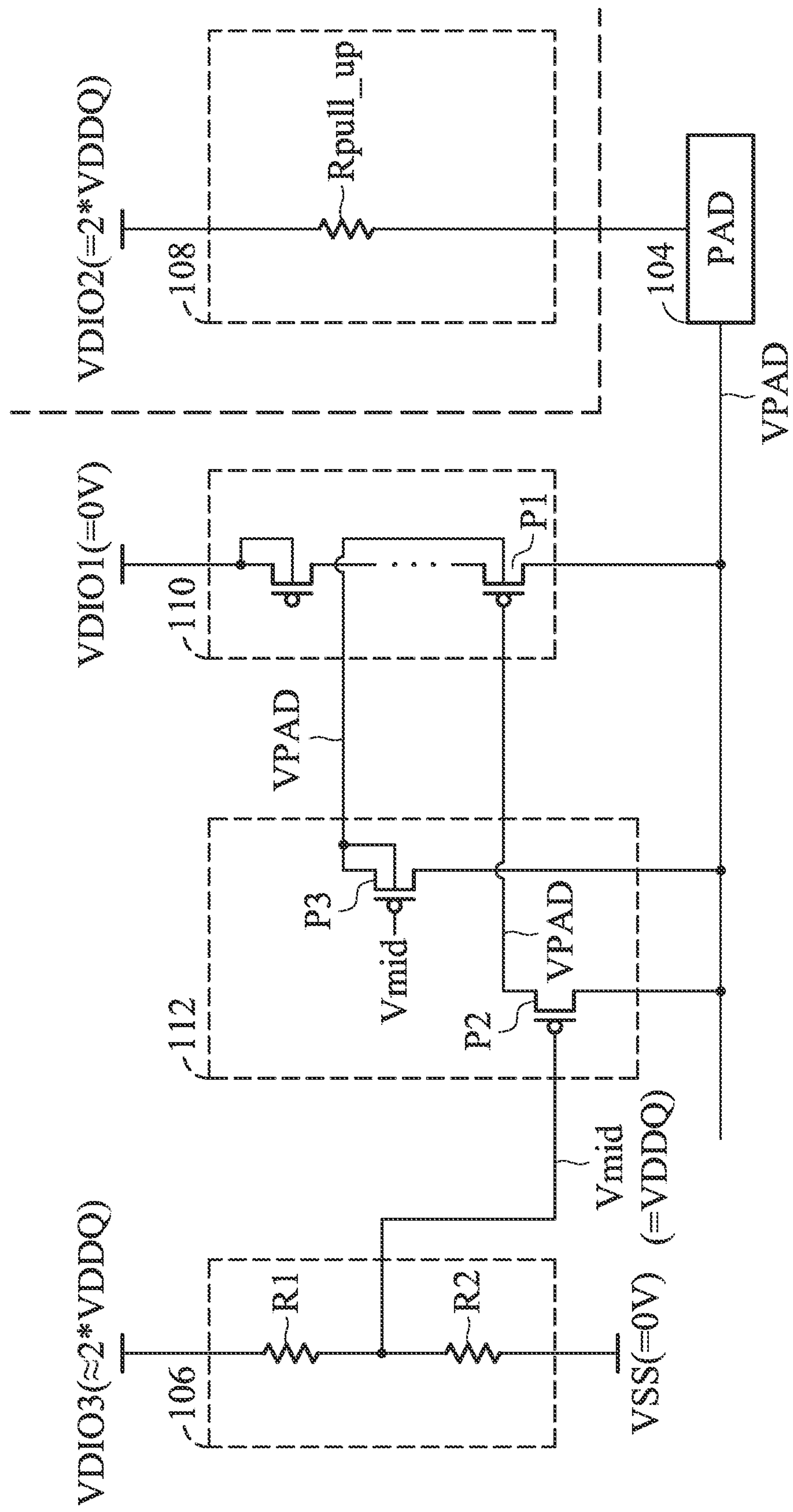
FIG. 2 illustrates the details of the bias circuit 106, the power-on system 108, the floating N-well pull-up string 110, and the pad-tracking circuit 112 in accordance with an exemplary embodiment of the present invention.

FIG. 2 illustrates the details of the bias circuit 106, the power-on system 108, the floating N-well pull-up string 110, and the pad-tracking circuit 112 in accordance with an exemplary embodiment of the present invention.

The bias circuit 106 is a voltage divider that uses two resistors R1 and R2 to divide the voltage (≈2*VDDQ) of the power VDIO3 to generate a divided voltage VDDQ as the bias signal Vmid. The power-on system 108 is represented by a resistor Rpull_up. One transistor (e.g., a PMOS) P1 in the floating N-well pull-up string 110 is used as a leakage-blocking transistor. The pad-tracking circuit 112 has a p-type transistor (e.g., a PMOS) P2 coupled between the gate of the leakage-blocking transistor P1 and the pad 104, and the gate of the p-type transistor P2 is controlled by the bias signal Vmid. The pad-tracking circuit 112 further has a p-type transistor (e.g., a PMOS) P3 coupled between the bulk of the leakage-blocking transistor P1 and the pad 104, and the gate of the p-type transistor P3 is controlled by the bias signal Vmid. When the system power VDIO2 is on (=2*VDDQ) and the chip's power VDIO1 is off (=0 volts), according to the bias signal Vmid (=VDDQ), the pad voltage VPAD (=2*VDDQ) is coupled to the gate of the leakage-blocking transistor P1 through the turned-on p-type transistor P2, and is coupled to the bulk of the leakage-blocking transistor P1 through the turned-on p-type transistor P3. Thus, the leakage-blocking transistor P1 is turned off, and the leakage path from the VDIO2 to the VDIO1 through the pad 104 and the floating N-well pull-up string 110 is broken.

Figure 3:
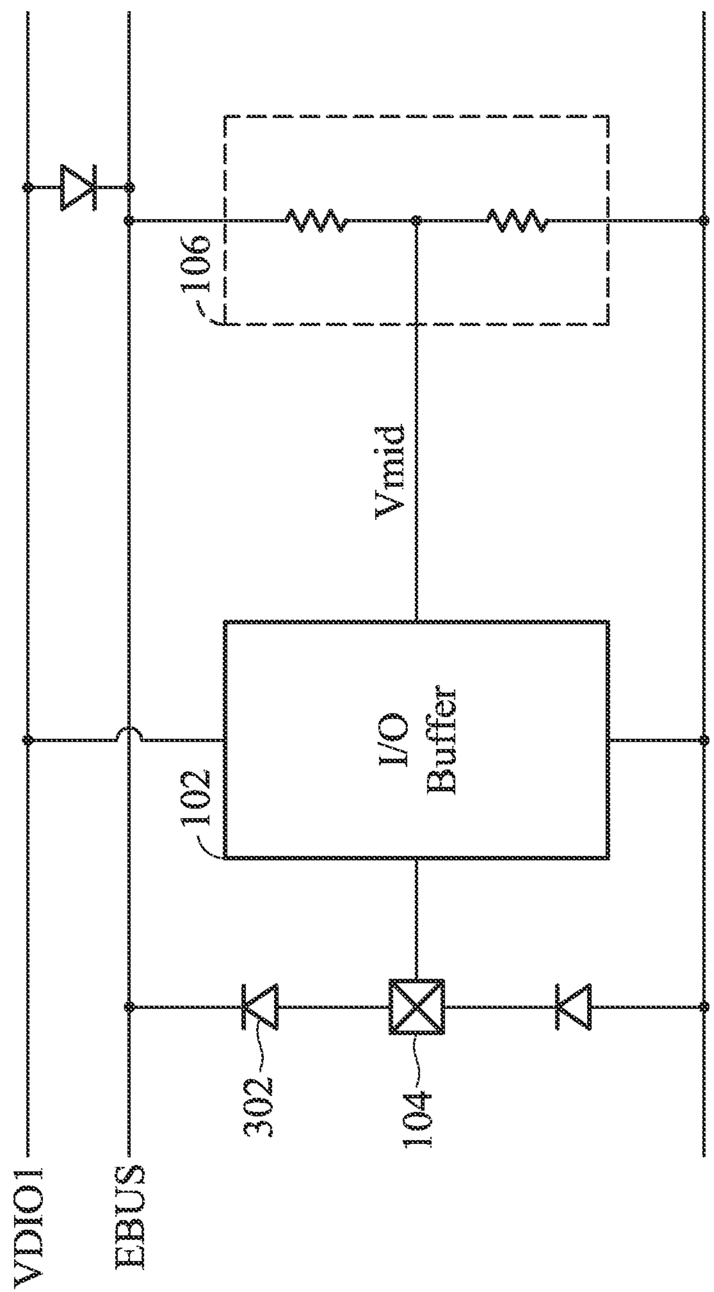
FIG. 3 shows details about how to power the bias circuit 106 by an electrostatic discharging bus (EBUS) in accordance with an exemplary embodiment of the present invention.

FIG. 3 details how to power the bias circuit 106 by an electrostatic discharging bus EBUS in accordance with an exemplary embodiment of the present invention. As shown, the pad 104 is coupled to the electrostatic discharging bus EBUS through a diode 302. When the system power VDIO2 coupled to the pad 104 is on (=2*VDDQ), the diode 302 couples the overdrive voltage level 2*VDDQ to the electrostatic discharging bus EBUS, and the bias circuit 106 generates the divided voltage VDDQ as the bias voltage Vmid for the I/O buffer 102.

Because the bias circuit 106 does not directly draw power from the pad 104, the bias circuit 106 is regarded as an external design not bounded within the I/O buffer 102. Thus, when a chip has multiple pads, the different I/O buffers of the different pads may share the same bias circuit.

Figure 4:
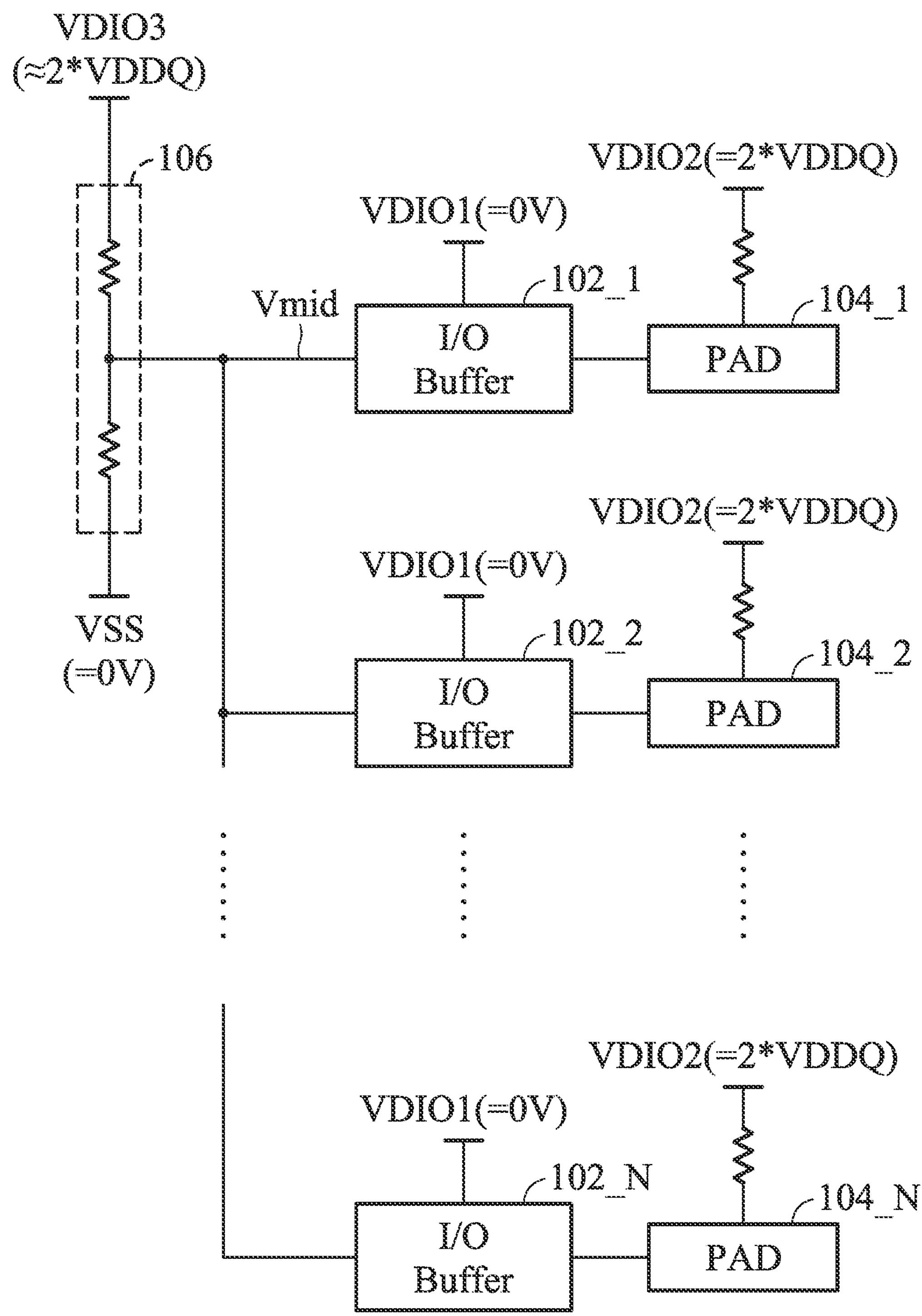
FIG. 4 illustrates a chip having a plurality of pads 104_1, 104_2 . . . 104_N, a plurality of I/O buffers 102_1, 102_2 . . . 102_N, and just one single bias circuit 106.

FIG. 4 illustrates a chip having a plurality of pads 104_1, 104_2 . . . 104_N, a plurality of I/O buffers 102_1, 102_2 . . . 102_N, and one single bias circuit 106. The bias signal Vmid (=VDDQ) generated by the single bias circuit 106 is dispatched to all I/O buffers 102_1, 102_2 . . . 102_N to block all leakage paths within the I/O buffers 102_1, 102_2 . . . 102_N when the system power VDIO2 is on (=2*VDDQ) and the chip's power VDIO1 is off (=0 volts).

Because just one single bias circuit 106 is required in the pad tracking of the multiple pads 104_1, 104_2 . . . 104_N, the power consumption due to the bias design is limited. In the conventional techniques, each I/O buffer is equipped with an exclusive bias circuit that directly draws power for the corresponding pad, and N I/O buffers require N bias circuits. Power consumption due to the bias requirement is suppressed to 1/N times by the forgoing external bias circuit.

Any chip comprising an I/O buffer using the external bias circuit (powered by an additional power that is independent from VDIO1 and is not drawn from any pad, or powered by an electrostatic discharging bus EBUS) should be regarded as within the scope of the present invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip with pad tracking, comprising:

a first input/output buffer and a first pad, wherein the first input/output buffer powered by a first power is coupled to the first pad, and the first pad is coupled to a system power;

a second input/output buffer and a second pad, wherein the second input/output buffer powered by the first power is coupled to the second pad, and the second pad is coupled to the system power; and a bias circuit, generating a bias signal which is dispatched to the first input/output buffer and the second input/output buffer to block a first leakage path within the first input/output buffer and a second leakage path within the second input/output buffer when the system power is on and the first power is off;

wherein:

the first input/output buffer comprises a first floating N-well pull-up string, and a first pad-tracking circuit;

according to the bias signal, the first pad-tracking circuit couples the first pad to a gate and a bulk of a first leakage-blocking transistor of the first floating N-well pull-up string;

the second input/output buffer comprises a second floating N-well pull-up string, and a second pad-tracking circuit; and according to the bias signal, the second pad-tracking circuit couples the second pad to a gate and a bulk of a second leakage-blocking transistor of the second floating N-well pull-up string.

2. The chip with pad tracking as claimed in claim 1, wherein:

the bias circuit is a voltage divider, which generates a divided voltage which serves as the bias signal to be dispatched to the first input/output buffer and the second input/output buffer both.

3. The chip with pad tracking as claimed in claim 2, wherein:

the bias circuit is powered by a second power that is independent from the first power and is not drawn from any of the first and second pads.

4. The chip with pad tracking as claimed in claim 2, further comprising:

an electrostatic discharging bus;

a first diode; and a second diode;

wherein:

a power terminal of the bias circuit is coupled to the electrostatic discharging bus;

the first pad is coupled to the electrostatic discharging bus through the first diode; and the second pad is coupled to the electrostatic discharging bus through the second diode.

5. The chip with pad tracking as claimed in claim 1, wherein:

the first pad-tracking circuit comprises a first p-type transistor coupled between the gate of the first leakage-blocking transistor and the first pad, and a gate of the first p-type transistor is controlled by the bias signal; and the second pad-tracking circuit comprises a second p-type transistor coupled between the gate of the second leakage-blocking transistor and the second pad, and a gate of the second p-type transistor is controlled by the bias signal.

6. The chip with pad tracking as claimed in claim 1, wherein:

the first pad-tracking circuit comprises a third p-type transistor coupled between the bulk of the first leakage-blocking transistor and the first pad, and a gate of the third p-type transistor is controlled by the bias signal; and the second pad-tracking circuit comprises a fourth p-type transistor coupled between the bulk of the second leakage-blocking transistor and the second pad, and a gate of the fourth p-type transistor is controlled by the bias signal.

7. A chip with pad tracking, comprising:

an input/output buffer and a pad, wherein the input/output buffer powered by a first power is coupled to the pad, and the pad is coupled to a system power;

a bias circuit, generating a bias signal to be transferred to the input/output buffer to block a leakage path within the input/output buffer when the system power is on and the first power is off, wherein:

the bias circuit is a voltage divider which generates a divided voltage as the bias signal;

the bias circuit is powered by a second power that is independent from the first power and is not drawn from the pad;

the input/output buffer comprises a floating N-well pull-up string, and a pad-tracking circuit; and according to the bias signal, the pad-tracking circuit couples the pad to a gate and a bulk of a leakage-blocking transistor of the floating N-well pull-up string.

8. The chip with pad tracking as claimed in claim 7, wherein:

the pad-tracking circuit comprises a p-type transistor coupled between the gate of the leakage-blocking transistor and the pad, and a gate of the p-type transistor is controlled by the bias signal.

9. The chip with pad tracking as claimed in claim 7, wherein:

the pad-tracking circuit comprises a p-type transistor coupled between the bulk of the leakage-blocking transistor and the pad, and a gate of the p-type transistor is controlled by the bias signal.

10. A chip with pad tracking, comprising:

an input/output buffer and a pad, wherein the input/output buffer powered by a first power is coupled to the pad, and the pad is coupled to a system power;

an electrostatic discharging bus and a diode, wherein the diode couples the pad to the electrostatic discharging bus;

a bias circuit, generating a bias signal to be transferred to the input/output buffer to block a leakage path within the input/output buffer when the system power is on and the first power is off, wherein:

the bias circuit is a voltage divider which generates a divided voltage as the bias signal;

a power terminal of the bias circuit is coupled to the electrostatic discharging bus;

the input/output buffer comprises a floating N-well pull-up string, and a pad-tracking circuit; and according to the bias signal, the pad-tracking circuit couples the pad to a gate and a bulk of a leakage-blocking transistor of the floating N-well pull-up string.

11. The chip with pad tracking as claimed in claim 10, wherein:

the pad-tracking circuit comprises a p-type transistor coupled between the gate of the leakage-blocking transistor and the pad, and a gate of the p-type transistor is controlled by the bias signal.

12. The chip with pad tracking as claimed in claim 10, wherein:

the pad-tracking circuit comprises a p-type transistor coupled between the bulk of the leakage-blocking transistor and the pad, and a gate of the p-type transistor is controlled by the bias signal.

* * * * *